United States Patent [19]

Idemaru et al.

[11] Patent Number: 5,280,259
[45] Date of Patent: Jan. 18, 1994

[54] SUPERCONDUCTIVE MAGNET DEVICE WITH TRANSPARENT PIPES FOR ACCOMMODATING FIELD CORRECTION SHIMS

[75] Inventors: Toshiki Idemaru; Tatuya Oue; Naoji Yoshida, all of Ako, Japan

[73] Assignee: Mitsubishi Denki K.K., Tokyo, Japan

[21] Appl. No.: 791,237

[22] Filed: Nov. 13, 1991

[30] Foreign Application Priority Data

Nov. 15, 1990 [JP] Japan ................... 2-312224

[51] Int. Cl.$^5$ ............................................. H01F 1/00
[52] U.S. Cl. ..................................... 335/216; 335/298
[58] Field of Search ............. 335/211, 214, 6, 296, 335/297, 298, 301, 304; 324/318, 319, 320, 322; 116/200, 209, 211, 224, 285, 281, 292, 294, 325, 335

[56] References Cited

U.S. PATENT DOCUMENTS

| | | |
|---|---|---|
| 4,148,273 | 4/1979 | Hollingsworth et al. .......... 116/325 |
| 4,698,611 | 10/1987 | Vermilyea . | 
| 4,743,853 | 5/1988 | Frese . |
| 4,803,433 | 2/1989 | McBride . |
| 4,879,538 | 11/1989 | Pausch . |
| 5,035,145 | 7/1991 | Spencer et al. ..................... 116/272 |

FOREIGN PATENT DOCUMENTS

| | | |
|---|---|---|
| 88/05167 | 7/1988 | European Pat. Off. . |
| 89/04494 | 5/1989 | European Pat. Off. . |
| 0167059 | 3/1990 | European Pat. Off. . |

Primary Examiner—Lincoln Donovan
Attorney, Agent, or Firm—Sughrue, Mion, Zinn, Macpeak & Seas

[57] ABSTRACT

A superconductive magnet device includes a superconductive magnet body and non-magnetic pipes made of a transparent non-magnetic material. Preferably, the magnetic shims for compensating for the inhomogeneous magnetic field components generated by the superconductive magnet body are colored in accordance with the kinds thereof. Thus, during the adjustment operation of the inhomogeneous magnetic field, the number, kinds, and the position of the magnetic shims within the non-magnetic pipes can be ascertained from without.

7 Claims, 4 Drawing Sheets

SUPERCONDUCTIVE MAGNET DEVICE WITH TRANSPARENT PIPES FOR ACCOMMODATING FIELD CORRECTION SHIMS

BACKGROUND OF THE INVENTION

This invention relates to superconductive magnet devices provided with magnetic shims for compensating for inhomogeneous magnetic field components and utilized, for example, in a magnetic resonance imaging system.

FIG. 4 is a perspective view of a conventional superconductive magnet device, and FIG. 5 is a side view of the main portion, as extracted from the housing, of the superconductive magnet device of FIG. 4. Within a superconductive magnet body 1 is formed a homogeneous magnetic field region 2. A number of non-magnetic pipes 3 are disposed on inner side of the superconductive magnet body 1 at predetermined circumferential spacings. Rod-shaped magnetic shims 4 are accommodated within the respective non-magnetic pipes 3. Stoppers 5 are inserted into both ends of the non-magnetic pipes 3 to confine the magnetic shims 4 within the non-magnetic pipes 3. The stoppers 5 also serve to position the magnetic shims 4 at predetermined axial positions along the lengths of the non-magnetic pipes 3. The non-magnetic pipes 3 are attached to the superconductive magnet body 1 via attachment frames 6.

It is extremely difficult to attain a sufficient homogeneity within the homogeneous magnetic field region 2 solely by means of the superconductive magnet body 1, due to insufficient manufacturing precision of the superconductive magnet body 1 or adverse effects of magnetic fields generated by neighboring magnetic parts. Thus, the homogeneity of the magnetic field within the homogeneous magnetic field region 2 is improved as follows.

First, the spatial magnetic field distribution within the homogeneous magnetic field region 2 is measured, and, upon the basis of the measurement, the magnitudes of the inhomogeneous magnetic field components are determined. Next, the kinds and number of the rod-shaped magnetic shims 4 required for compensating for the respective inhomogeneous magnetic field components are selected. The selected magnetic shims 4 are inserted into the non-magnetic pipes 3 at the predetermined positions, and are positioned along the lengths of the non-magnetic pipes 3 by means of the stoppers 5.

The spatial magnetic field distribution within the homogeneous magnetic field region 2 is measured again to ascertain whether or not the resulting magnetic field satisfies the prescribed homogeneity. If the homogeneity is below the prescribed level, the above-described steps of measurements and selections of the non-magnetic pipes 3 are repeated until the prescribed homogeneity level is attained.

By the way, in the above-described steps of inhomogeneous magnetic field compensation, the kinds and the number of the magnetic shims 4 inserted into the non-magnetic pipes 3 and the positions of the magnetic shims 4 within the non-magnetic pipes 3, etc., are recorded after every step, such that the compensation procedures up to the present can be comprehended at once.

The above conventional superconductive magnet device thus has the following disadvantage. Namely, during the compensation procedure of the inhomogeneous magnetic fields, the kinds and number of the magnetic shims 4 must be recorded precisely every time the magnetic shims 4 are changed and inserted into the non-magnetic pipes 3. Further, if the record contains an error, all the magnetic shims 4 must once be removed from the non-magnetic pipes 3 to confirm the kinds and the number of the magnetic shims 4. When the magnetic shims 4 are thus removed, it is necessary to ascertain the position of the magnetic shims 4 within the non-magnetic pipes 3. To do this, the operator must look into the non-magnetic pipes 3 from their ends. This is dangerous since the magnetic shims 4 may jump out of the non-magnetic pipes 3 due to the attraction of the magnetic field generated by the magnet.

SUMMARY OF THE INVENTION

It is therefore an object of this invention to provide a superconductive magnet device by which the kinds, number, and the axial positions of the magnetic shims within the non-magnetic pipes can be ascertained easily from without, such that the inhomogeneous magnetic field compensation procedure is greatly facilitated.

The above object is accomplished in accordance with the principle of this invention by a superconductive magnet device which includes: a hollow cylindrical superconductive magnet body for generating a main magnetic field therewithin; non-magnetic pipes made of a transparent non-magnetic material attached on said superconductive magnet body; and rod-shaped magnetic shims inserted into said non-magnetic pipes for compensating for inhomogeneous magnetic field components generated by said superconductive magnet body. Preferably, said magnetic shims are colored in accordance with kinds thereof, different kinds of magnetic shims being colored with distinct colors.

BRIEF DESCRIPTION OF THE DRAWINGS

The features which are believed to be characteristic of this invention are set forth with particularity in the appended claims. The structure and method of operation of this invention itself, however, will be best understood from the following detailed description, taken in conjunction with the accompanying drawings, in which:

In the drawings, like reference numerals represent like or corresponding parts or portions.

DETAILED DESCRIPTION OF THE PREFERRED EMBODIMENTS

Referring now to the accompanying drawings, the preferred embodiments of this invention are described.

Figure 1:
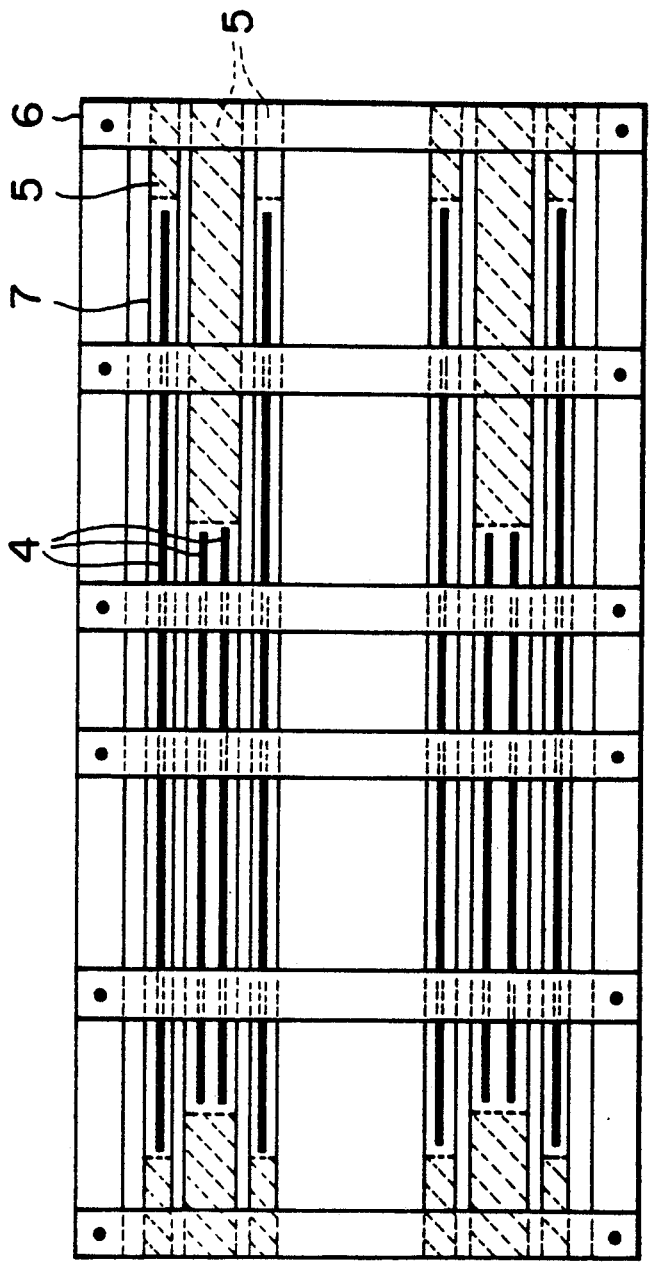
FIG. 1 is a side view of the main portion, as extracted from the housing, of a superconductive magnet device according to an embodiment of this invention.
Figure 4:
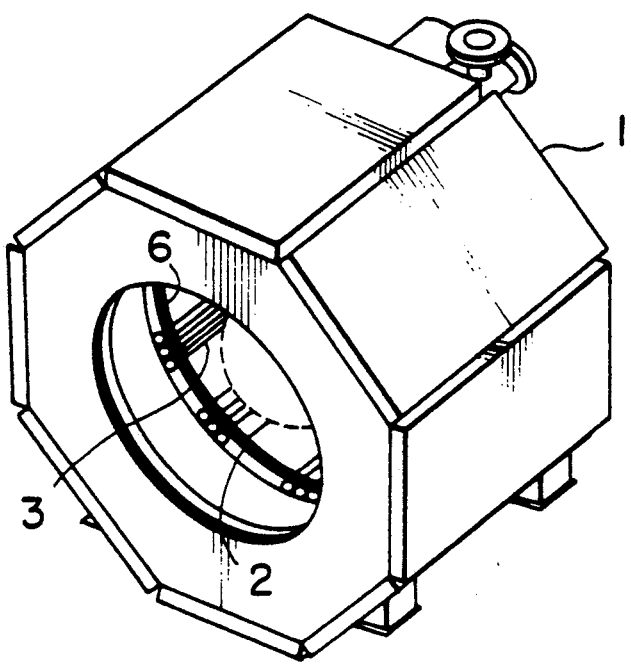
FIG. 4 is a perspective view of a conventional superconductive magnet device.
Figure 5:
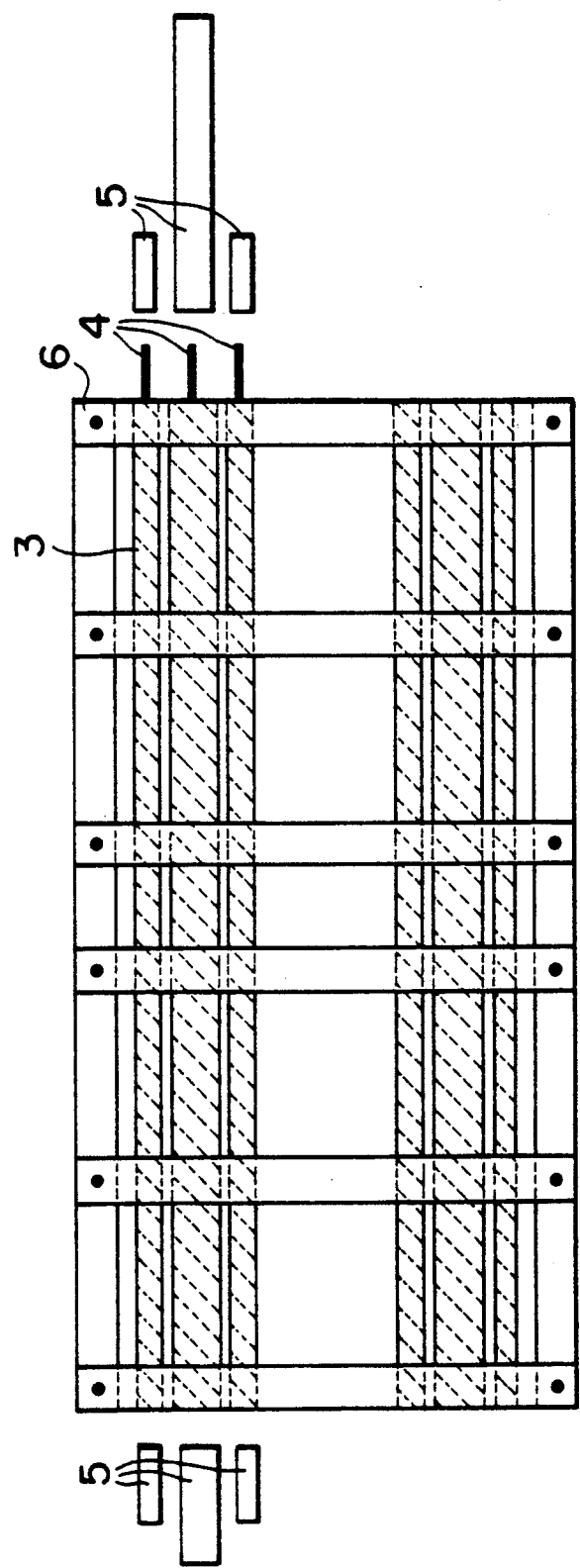
FIG. 5 is a side view of the main portion, as extracted from the housing, of the superconductive magnet device of FIG. 4.

FIG. 1 is a side view of the main portion, as extracted from the housing, of a superconductive magnet device according to an embodiment of this invention. The superconductive magnet device is similar to that of FIGS. 4 and 5 described above. Thus, the magnetic shims 4, the stoppers 5, and the attachment frames 6 are identical to those of FIG. 5. However, the non-magnetic pipes 7 for accommodating the magnetic shims 4 therein are made of a transparent non-magnetic material such as a polycarbonate resin, which is tough and clear. Thus, the magnetic shims 4 accommodated within the non-magnetic pipes 7 can be observed from without.

The correction of the magnetic field inhomogeneity within the homogeneous magnetic field region 2 is effected in a manner similar to that for the conventional device described above. However, since the non-magnetic pipes 7 are transparent, the number, kinds, and the axial positions within the non-magnetic pipes 7 of the magnetic shims 4 can easily be ascertained by the eye from without (i.e., through visual inspection). Thus, it becomes unnecessary to look into an end of the non-magnetic pipes 7 when removing the magnetic shims 4 from the non-magnetic pipes 7. The magnetic shims 4 can thus be removed from the non-magnetic pipes 7 with a scissors-like jig while the position thereof is observed from without. The magnetic field correction procedure thus becomes easy and safe.

Figure 2:
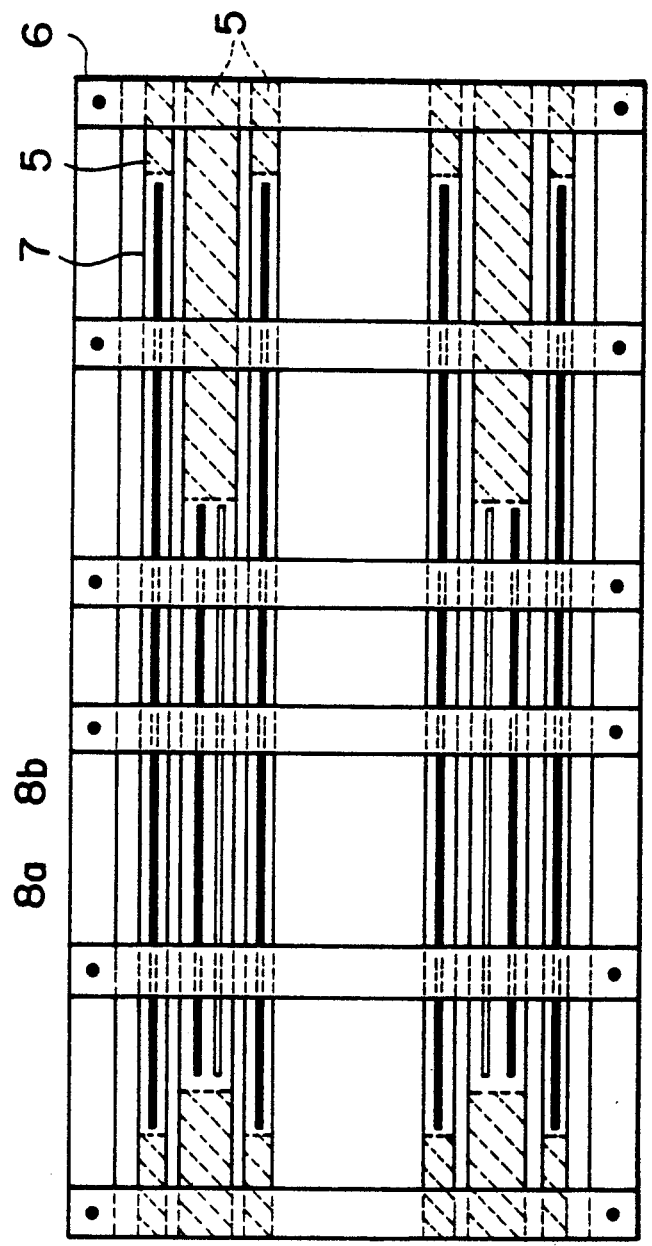
FIG. 2 is a side view of the main portion, as extracted from the housing, of a superconductive magnet device according to another embodiment of this invention.

FIG. 2 is a side view of the main portion, as extracted from the housing, of a superconductive magnet device according to another embodiment of this invention. The superconductive magnet device of FIG. 2 is similar to that of FIG. 1. Thus, the non-magnetic pipes 7 are made of a transparent non-magnetic material such as polycarbonates. In addition, the magnetic shims 8a and 8b are colored in accordance with the kinds thereof. Different kinds of the magnetic shims 8a and 8b are colored with distinct colors, such that, not only the axial positions and the number, but also the kinds of the magnetic shims 8a and 8b accommodated within the non-magnetic pipes 7 can be ascertained from without.

Figure 3:
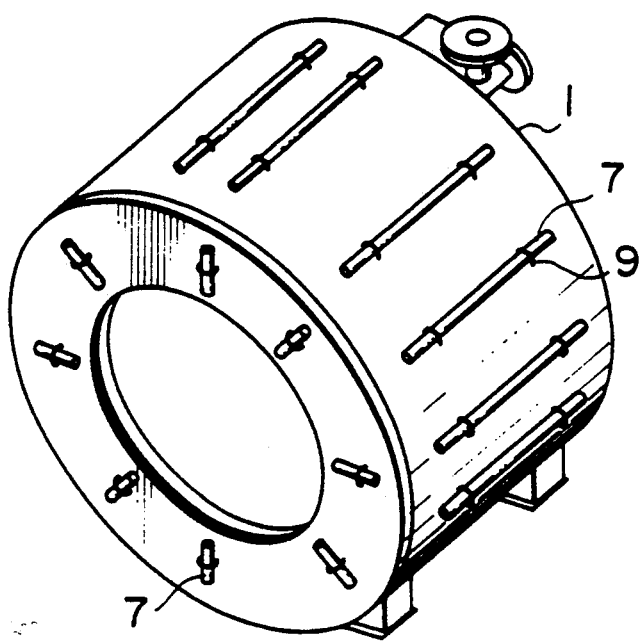
FIG. 3 is a perspective view of a superconductive magnet device according to still another embodiment of this invention.

In the case of the superconductive magnet device of FIGS. 1 and 2, the non-magnetic pipes 7 are disposed within the superconductive magnet body 1. However, as shown in FIG. 3, the non-magnetic pipes 7 made of a transparent non-magnetic material for accommodating the magnetic shims may be attached on the exterior of the superconductive magnet body 1 via attachment rings 9. The same advantage as described above can also be obtained by the transparent non-magnetic pipes 7.

What is claimed is:

1. A superconductive magnet device comprising:
    a hollow cylindrical superconductive magnetic body for generating a main magnetic field therein;
    non-magnetic pipes made of a transparent non-magnetic material attached on said superconductive magnetic body; and
    rod-shaped magnetic shims inserted into said non-magnetic pipes for compensating for inhomogeneous magnetic field components generated by said superconductive magnetic body, said transparent material allowing visual inspection of the shims through sides of the non-magnetic pipes.

2. A superconductive magnet device as claimed in claim 1, wherein said magnetic shims are colored in accordance with kinds thereof, different kinds of magnetic shims being colored with distinct colors.

3. A superconductive magnetic device as claimed in claim 1, wherein said non-magnetic pipes are made of a polycarbonate resin.

4. A superconductive magnetic device as claimed in claim 1, wherein a number, kind and position of said magnetic shims in a non-magnetic pipe is ascertainable by visual inspection through sides of the pipes, without removing said magnetic shims from ends of the non-magnetic pipes.

5. A superconductive magnetic device as claimed in claim 1, wherein said magnetic shims are removable from the non-magnetic pipe with a scissor-like jig while a position of said magnetic shims is observed from without through the transparent material, in order to facilitate correction of said magnetic field.

6. A superconductive magnetic device as claimed in claim 2, wherein said distinct colors of said magnetic shims are used to ascertain the kind of magnetic shim in a particular non-magnetic pipe by visually inspecting the shim through a side of the non-magnetic pipe.

7. As superconductive magnetic device as claimed in claim 1, wherein said non-magnetic pipes are attached to an exterior of the hollow cylindrical superconductive magnetic body.

* * * * *